(12) United States Patent
Wheeler et al.

(10) Patent No.: US 7,197,724 B2
(45) Date of Patent: Mar. 27, 2007

(54) MODELING A LOGIC DESIGN

(75) Inventors: William R. Wheeler, Southborough, MA (US); Timothy J. Fennell, Holliston, MA (US)

(73) Assignee: Intel Corporation, Santa Clara, CA (US)

(*) Notice: Subject to any disclaimer, the term of this patent is extended or adjusted under 35 U.S.C. 154(b) by 443 days.

(21) Appl. No.: 10/054,179

(22) Filed: Jan. 17, 2002

(65) Prior Publication Data

US 2003/0135355 A1 Jul. 17, 2003

(51) Int. Cl.
*G06F 17/50* (2006.01)

(52) U.S. Cl. .......................................... 716/4; 703/13
(58) Field of Classification Search ................. 716/11, 716/1
See application file for complete search history.

(56) References Cited

U.S. PATENT DOCUMENTS

| | | | |
|---|---|---|---|
| 4,703,435 A | 10/1987 | Darringer et al. | |
| 4,970,664 A | 11/1990 | Kaiser et al. | |
| 5,128,871 A | 7/1992 | Schmitz | |
| 5,212,650 A | 5/1993 | Hooper et al. | |
| 5,220,512 A * | 6/1993 | Watkins et al. | 716/11 |
| 5,258,919 A | 11/1993 | Yamanouchi et al. | |
| 5,267,175 A | 11/1993 | Hooper | |
| 5,278,769 A | 1/1994 | Bair et al. | |
| 5,287,289 A | 2/1994 | Kageyama et al. | |
| 5,297,053 A | 3/1994 | Pease et al. | |
| 5,301,318 A | 4/1994 | Mittal | |
| 5,371,851 A * | 12/1994 | Pieper et al. | 345/501 |
| 5,384,710 A | 1/1995 | Lam et al. | |
| 5,475,605 A | 12/1995 | Lin | |
| 5,493,507 A | 2/1996 | Shinde et al. | |
| 5,506,788 A | 4/1996 | Cheng et al. | |
| 5,513,119 A | 4/1996 | Moore et al. | |
| 5,544,067 A | 8/1996 | Rostoker et al. | |
| 5,553,002 A | 9/1996 | Dangelo et al. | |
| 5,568,397 A | 10/1996 | Yamashita et al. | |
| 5,598,347 A | 1/1997 | Iwasaki | |
| 5,603,015 A | 2/1997 | Kurosawa et al. | |

(Continued)

FOREIGN PATENT DOCUMENTS

EP 0 404 482 12/1990

(Continued)

OTHER PUBLICATIONS

Foley et al., "An Object Based Graphical User Interface for Power Systems", IEEE Transactions on Power Systems, vol. 8, No. 1, Feb. 1993, pp. 97-104.

(Continued)

*Primary Examiner*—Leigh M. Garbowski
(74) *Attorney, Agent, or Firm*—Fish & Richardson P.C.

(57) ABSTRACT

Modeling a logic design includes displaying a menu comprised of different types of functional block diagrams, receiving an input selecting one of the different types of functional block diagrams, retrieving a selected functional block diagram, and creating a graphical representation of a logic design using the selected functional block diagram. The graphical representation is created by interconnecting the selected functional block diagram with one or more other functional block diagrams to generate a model of a logic design and defining the selected functional block diagram using simulation code if the functional block diagram is undefined when retrieved.

24 Claims, 5 Drawing Sheets

U.S. PATENT DOCUMENTS

| | | | |
|---|---|---|---|
| 5,604,894 A | 2/1997 | Pickens et al. | |
| 5,629,857 A * | 5/1997 | Brennan | 716/11 |
| 5,650,947 A | 7/1997 | Okumura | |
| 5,663,662 A | 9/1997 | Kurosawa | |
| 5,666,289 A | 9/1997 | Watkins | |
| 5,673,198 A | 9/1997 | Lawman et al. | |
| 5,685,006 A | 11/1997 | Shiraishi | |
| 5,694,579 A | 12/1997 | Razdan et al. | |
| 5,706,476 A | 1/1998 | Giramma | |
| 5,717,928 A | 2/1998 | Campmas et al. | |
| 5,724,250 A | 3/1998 | Kerzman et al. | |
| 5,757,655 A | 5/1998 | Shih et al. | |
| 5,809,283 A | 9/1998 | Vaidyanathan et al. | |
| 5,828,581 A | 10/1998 | Matumura | |
| 5,831,869 A | 11/1998 | Ellis et al. | |
| 5,841,663 A | 11/1998 | Sharma et al. | |
| 5,852,564 A * | 12/1998 | King et al. | 703/14 |
| 5,889,677 A | 3/1999 | Yasuda et al. | |
| 5,892,678 A | 4/1999 | Tokunoh et al. | |
| 5,892,682 A | 4/1999 | Hasley et al. | |
| 5,903,469 A | 5/1999 | Ho | |
| 5,911,061 A | 6/1999 | Tochio et al. | |
| 5,933,356 A | 8/1999 | Rostoker et al. | |
| 5,937,190 A | 8/1999 | Gregory et al. | |
| 5,963,724 A | 10/1999 | Mantooth et al. | |
| 5,974,242 A | 10/1999 | Damarla et al. | |
| 6,044,211 A | 3/2000 | Jain | |
| 6,053,947 A | 4/2000 | Parson | |
| 6,066,179 A | 5/2000 | Allan | |
| 6,077,304 A | 6/2000 | Kasuya | |
| 6,106,568 A | 8/2000 | Beausang et al. | |
| 6,117,183 A * | 9/2000 | Teranishi et al. | 716/11 |
| 6,120,549 A | 9/2000 | Goslin et al. | |
| 6,132,109 A | 10/2000 | Gregory et al. | |
| 6,135,647 A | 10/2000 | Balakrishnan et al. | |
| 6,152,612 A | 11/2000 | Liao et al. | |
| 6,161,211 A | 12/2000 | Southgate | |
| 6,178,541 B1 | 1/2001 | Joly et al. | |
| 6,205,573 B1 | 3/2001 | Hasegawa | |
| 6,208,954 B1 | 3/2001 | Houtchens | |
| 6,216,256 B1 | 4/2001 | Inoue et al. | |
| 6,219,822 B1 | 4/2001 | Griestede et al. | |
| 6,223,148 B1 | 4/2001 | Stewart et al. | |
| 6,226,780 B1 | 5/2001 | Bahra et al. | |
| 6,233,540 B1 | 5/2001 | Schaumont et al. | |
| 6,233,723 B1 | 5/2001 | Pribetich | |
| 6,234,658 B1 | 5/2001 | Houldsworth | |
| 6,236,956 B1 | 5/2001 | Mantooth et al. | |
| 6,260,179 B1 | 7/2001 | Ohsawa et al. | |
| 6,272,671 B1 * | 8/2001 | Fakhry | 716/18 |
| 6,275,973 B1 | 8/2001 | Wein | |
| 6,292,931 B1 | 9/2001 | Dupenloup | |
| 6,298,468 B1 | 10/2001 | Zhen | |
| 6,311,309 B1 | 10/2001 | Southgate | |
| 6,324,678 B1 | 11/2001 | Dangelo et al. | |
| 6,327,693 B1 | 12/2001 | Cheng et al. | |
| 6,353,806 B1 | 3/2002 | Gehlot | |
| 6,353,915 B1 | 3/2002 | Deal et al. | |
| 6,360,356 B1 | 3/2002 | Eng | |
| 6,366,874 B1 * | 4/2002 | Lee et al. | 703/14 |
| 6,378,115 B1 | 4/2002 | Sakurai | |
| 6,381,563 B1 | 4/2002 | O'Riordan et al. | |
| 6,381,565 B1 | 4/2002 | Nakamura | |
| 6,401,230 B1 | 6/2002 | Ahanessians et al. | |
| 6,421,816 B1 | 7/2002 | Ishikura | |
| 6,438,729 B1 | 8/2002 | Ho | |
| 6,438,731 B1 | 8/2002 | Segal | |
| 6,440,780 B1 | 8/2002 | Kimura et al. | |
| 6,449,762 B1 | 9/2002 | McElvain | |
| 6,457,164 B1 | 9/2002 | Hwang et al. | |
| 6,473,885 B1 | 10/2002 | Wallace | |
| 6,477,683 B1 | 11/2002 | Killian et al. | |
| 6,477,688 B1 | 11/2002 | Wallace | |
| 6,477,689 B1 | 11/2002 | Mandell et al. | |
| 6,480,985 B1 | 11/2002 | Reynolds et al. | |
| 6,487,698 B1 | 11/2002 | Andreev et al. | |
| 6,490,545 B1 | 12/2002 | Peng | |
| 6,505,328 B1 | 1/2003 | Van Ginneken et al. | |
| 6,505,341 B1 | 1/2003 | Harris et al. | |
| 6,516,456 B1 | 2/2003 | Garnett et al. | |
| 6,519,742 B1 | 2/2003 | Falk | |
| 6,519,755 B1 | 2/2003 | Anderson | |
| 6,523,156 B2 | 2/2003 | Cirit | |
| 6,539,536 B1 | 3/2003 | Singh et al. | |
| RE38,059 E | 4/2003 | Yano et al. | |
| 6,546,528 B1 | 4/2003 | Sasaki et al. | |
| 6,574,787 B1 | 6/2003 | Anderson | |
| 6,591,407 B1 | 7/2003 | Kaufman et al. | |
| 6,684,379 B2 * | 1/2004 | Skoll et al. | 716/11 |
| 6,704,873 B1 | 3/2004 | Underwood | |
| 6,745,160 B1 | 6/2004 | Ashar et al. | |
| 6,785,873 B1 | 8/2004 | Tseng | |
| 2001/0018758 A1 | 8/2001 | Tanaka et al. | |
| 2002/0023256 A1 | 2/2002 | Seawright | |
| 2002/0038447 A1 | 3/2002 | Kim et al. | |
| 2002/0042904 A1 | 4/2002 | Ito et al. | |
| 2002/0046386 A1 | 4/2002 | Skoll et al. | |
| 2002/0049957 A1 | 4/2002 | Hosono et al. | |
| 2002/0059054 A1 | 5/2002 | Bade et al. | |
| 2002/0112221 A1 | 8/2002 | Ferreri et al. | |
| 2002/0138244 A1 | 9/2002 | Meyer | |
| 2002/0166100 A1 | 11/2002 | Meding | |
| 2003/0004699 A1 | 1/2003 | Choi et al. | |
| 2003/0005396 A1 | 1/2003 | Chen et al. | |
| 2003/0016206 A1 | 1/2003 | Taitel | |
| 2003/0016246 A1 | 1/2003 | Singh | |
| 2003/0036871 A1 | 2/2003 | Fuller et al. | |
| 2003/0177455 A1 | 9/2003 | Kaufman et al. | |
| 2004/0143801 A1 | 7/2004 | Waters et al. | |

FOREIGN PATENT DOCUMENTS

| | | |
|---|---|---|
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO 98/37475 | 8/1998 |
| WO | WO 98/55879 | 12/1998 |
| WO | WO 99/39268 | 8/1999 |
| WO | WO 00/65492 | 11/2000 |

OTHER PUBLICATIONS

Pedram et al., "Floorplanning with Pin assignment", 1990 IEEE International Conference on Computer-Aided Design, Nov. 11, 1990, pp. 98-101.

Renoir, HDL Design Datasheet, Mentor Graphics, 1-8, 1999.

Mentor Graphics Corporation, Renoir™ With HDL2Graphics™, pp. 1-6, 1998, Oregon.

Mentor Graphics Corporation, Renoir HDL Design Datasheet, pp. 1-2, 1999, Oregon.

Computer Design, "After Hard Knocks, Cycle-Based Simulators Stand Their Ground". http://www.computer-design.com/Editorial/1996/10/ASIC/after.html, accessed on Aug. 23, 2001, pp. 1-5.

Gassenfeit, E. H., "Control System Design Realization via VHDL-A: Requirements", Proceedinga of the 1996 IEEE International Symposium on Computer-Aided Control System Design, Sep. 15, 1996, pp. 282-285.

Kutzschebauch, "Efficient logic optimization using regularity extraction", Proceedings of 2000 International Conference on Computer Design, Sep. 17, 2000, pp. 487-493.

Lahti, et al., "SADE: a Graphical Toll for VHDL-Based System Analysis", 1991 IEEE International Conference on Computer-Aided Design, Nov. 11, 1991, pp. 262-265.

Lin, et al., "A Goal Tree Based High-Level Test Planning System for DSP Real Number Models", 1998 Proceedings of International Test Conference, Oct. 18, 1998, pp. 1000-1009.

Maxfield, C., "Digital Logic Simulation: Event-Driven, Cycle-Based, and Home-Brewed", *Electrical Design News*, 41(14):129-136 (1996).

NB84035598, "Binary Relational Schema to Model Structured LSI Design", IBM Technical Disclosure Bulletin, vol. 26, No. 10B, Mar. 1984, pp. 5598-5601.

NN7807629, "Functional Oriented Symbolic Macromodeling Algorithm", IBM Technical Disclosure Bulletin, vol. 21, No. 2, Jul. 1978, pp. 629-631.

NN8006341, "Macro Physical-To-Logical Checking LSI Chip Design", IBM Technical Disclosure Bulletin, vol. 23, No. 1, Jun. 1980, pp. 341-345.

NN9407481, "Functional Modeling using object Collaboration Diagram", IBM Technical Disclosure Bulletin, vol. 37, No. 7, Jul. 1994, pp. 481-486.

Parlakbilek, et al., "A Multiple-Strength Multiple-Delay Complied-Code Logic Simulator", *IEEE Transactions on Computer-Aided Design of Integrated Circuits and Systems*, 12(12):1937-1946 (1993).

Su, Stephen, "An Interactive Design Automation System", *Proceedings of the 10th Design Automation Workshop on Design Automation*, pp. 253-261, Jun. 1973.

Yli-Pietila, et al., "The Design and Simulation of Complex Multitechnology Systems", IEEE International Conference on Systems Engineering, Aug. 9, 1990, pp. 474-477.

\* cited by examiner

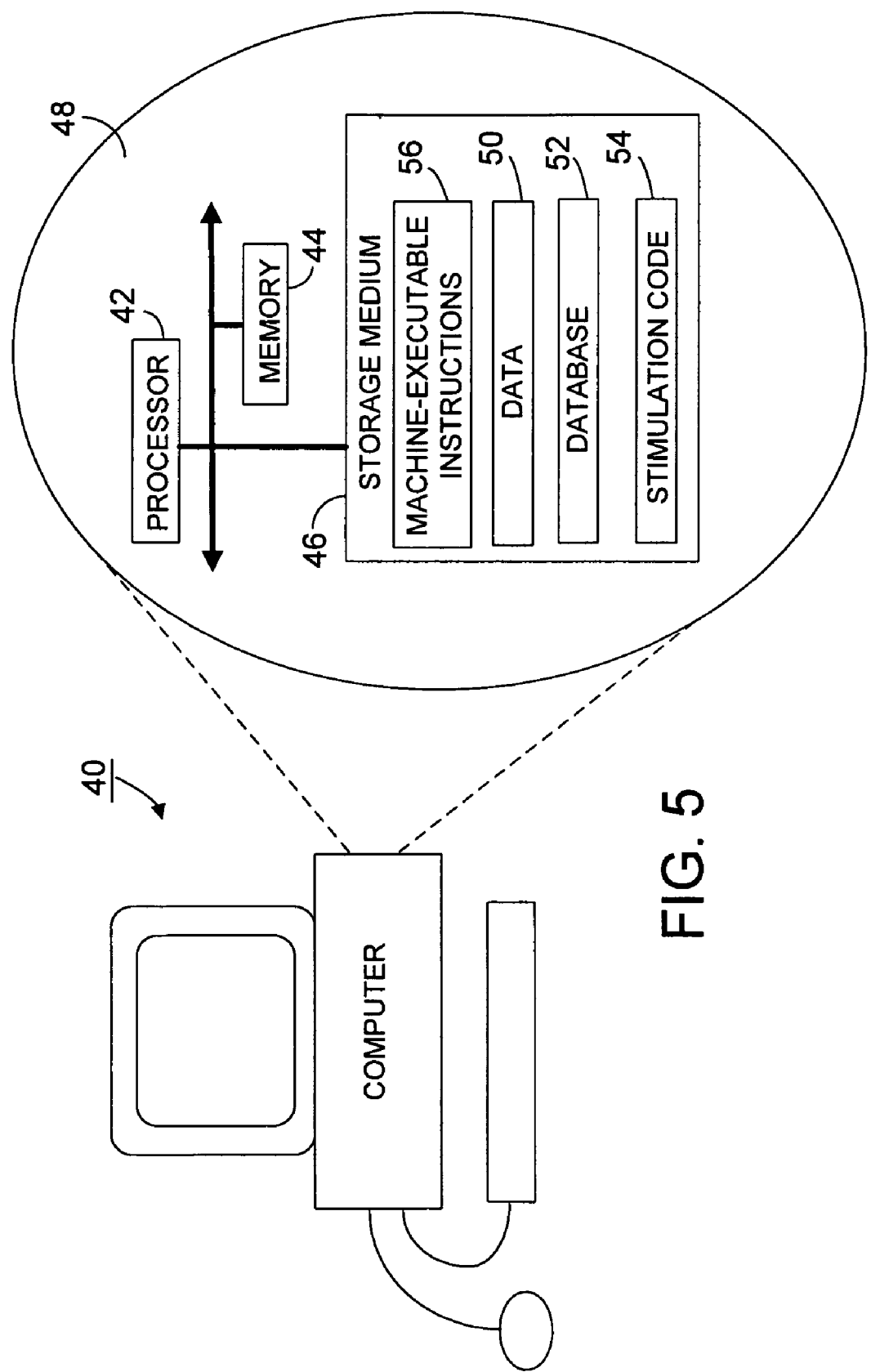

MODELING A LOGIC DESIGN

TECHNICAL FIELD

This invention relates to modeling a logic design using functional block diagrams and to generating simulation code that corresponds to the logic design.

BACKGROUND

Logic designers typically model logic designs, which may include circuit elements such as flip-flops, registers, and logic gates, using block diagrams. Computer-aided design (CAD) systems may be used to generate such block diagrams electronically. Conventional CAD systems, however, do not provide the flexibility and types/extent of information desired by many logic designers.

Moreover, models created using conventional CAD systems are often of little assistance when simulating the logic design. Heretofore, a logic designer had to make a separate "simulation" model of the logic design using a simulation code, such as Verilog and Very High-Level Design Language (VHDL). The simulation model can be cumbersome and difficult to understand, particularly for complex logic designs.

DESCRIPTION OF THE DRAWINGS

FIG. 5 is a block diagram of a computer system on which the process of FIG. 1 may be executed.

DESCRIPTION

Figure 1:
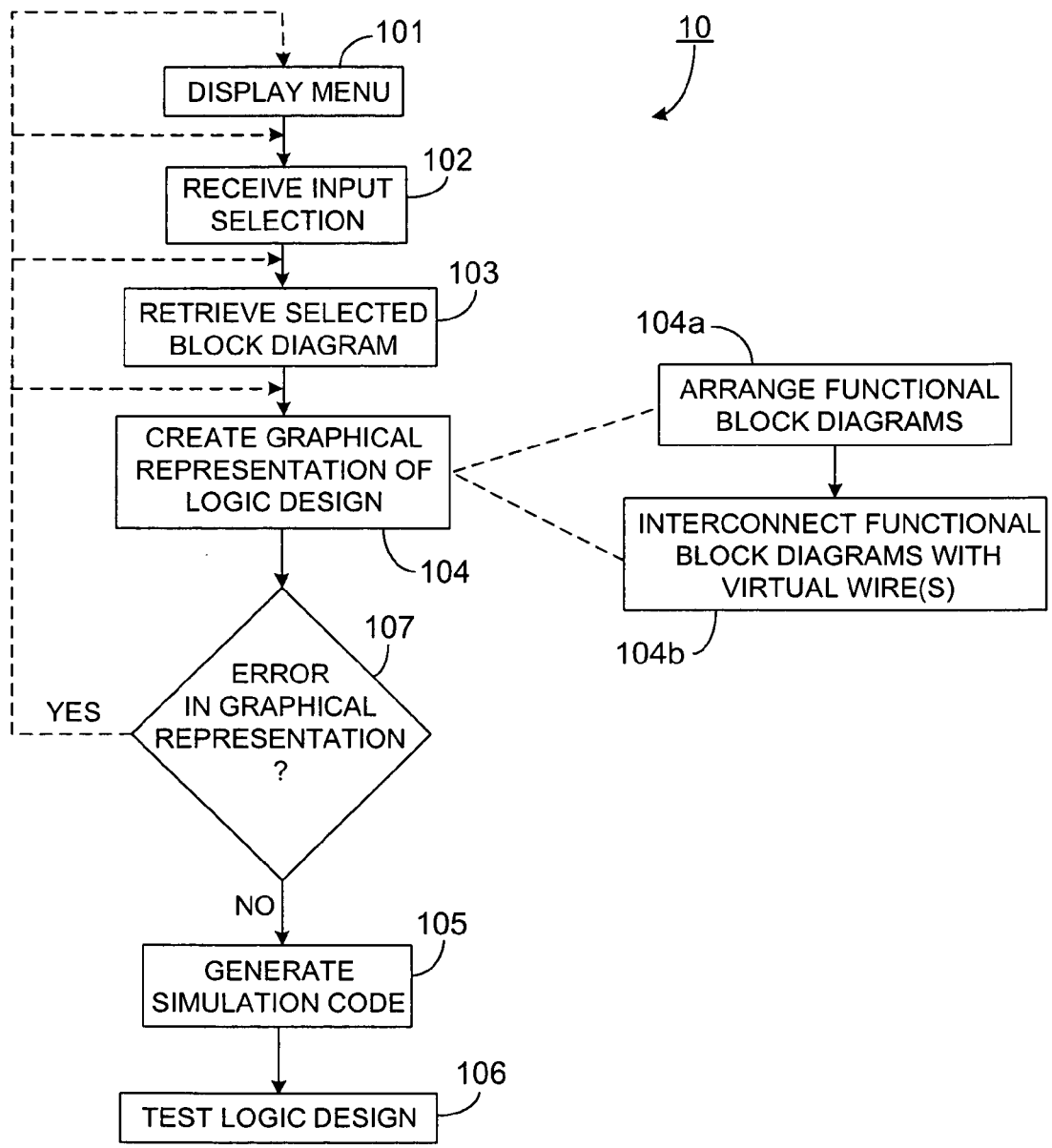
FIG. 1 is a flowchart showing a process for modeling a logic design using functional block diagrams and generating simulation code that corresponds to the logic design.

Referring to FIG. 1, a process 10 is shown for modeling a logic design. Process 10 may be implemented using a computer program running on a computer or other type of programmable machine, as described in more detail below.

Figure 2:
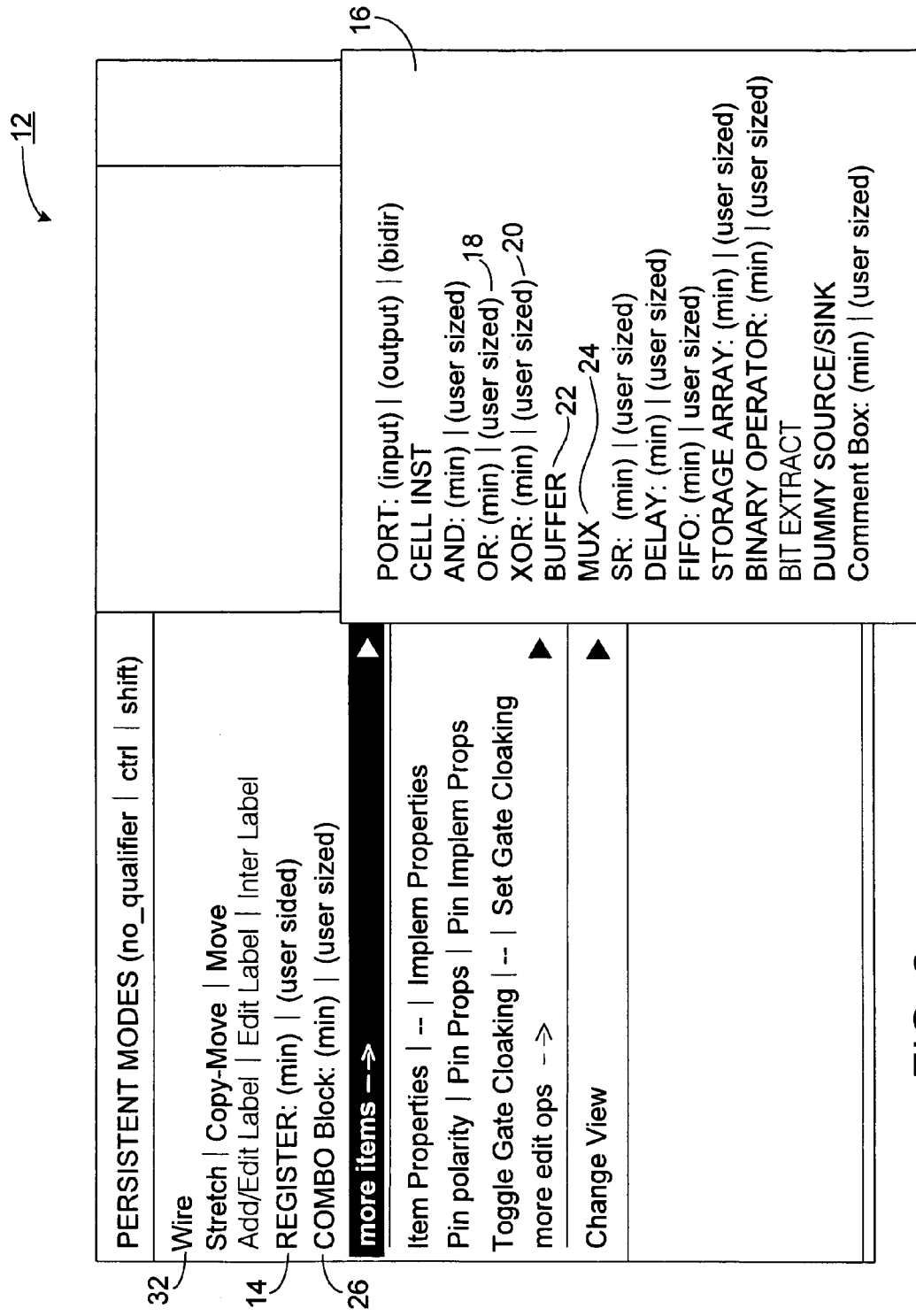
FIG. 2 is a block diagram of a menu for selecting functional block diagrams for the logic design.

In operation, process 10 displays (101) a menu, such as menu 12 shown in FIG. 2. Menu 12 includes options for use in creating a graphical representation of a logic design. These options correspond to functional block diagrams for various circuit elements, such as registers 14, ports 16, AND gates 18, OR gates 20, buffers 22, multiplexers 24 (MUX), and so forth. Data, including computer code, that defines the functional block diagrams for these circuit elements is stored in a database. The data defines inputs and outputs of each functional block diagram, as well as the operation to be performed on the inputs by the functional block diagram to generate the outputs. In one embodiment, the functional block diagrams are software "objects". By way of example, in the case of an "AND" gate, the data specifies that the functional block diagram includes N (N>1) inputs, one output, and the definition of an operation to be performed on the inputs to generate the output. In the case of state elements, such as registers and flip-flops, the inputs may include one or more clock signals.

The options on menu 12 also include a combinational (COMBO) box option 26. COMBO box option 26 provides an undefined functional block diagram for use in a logic design. The undefined functional block diagram may be defined by the user to simulate any circuit element or combination of circuit elements. The user may enter simulation code via a graphical user interface (GUI) (not shown) to define the functionality of an undefined functional block diagram. The simulation code may specify inputs, outputs and operations to be performed on the inputs to generate the outputs. Examples of simulation code that may be used include, but are not limited to, Verilog, C++ and VHDL.

Process 10 receives (102) an input selection from menu 12. That is, a designer selects one or more of the options from menu 12. The selection is transmitted to process 10, which retrieves (103), from the database, a functional block diagram that corresponds to the selection. For example, a designer may select register option 14. In response, process retrieves a "register" functional block diagram from the database. If the designer selects COMBO box option 26, process 10 retrieves an undefined functional block diagram from the database. The designer specifies the function of that block diagram using, e.g., simulation code.

Figure 3:
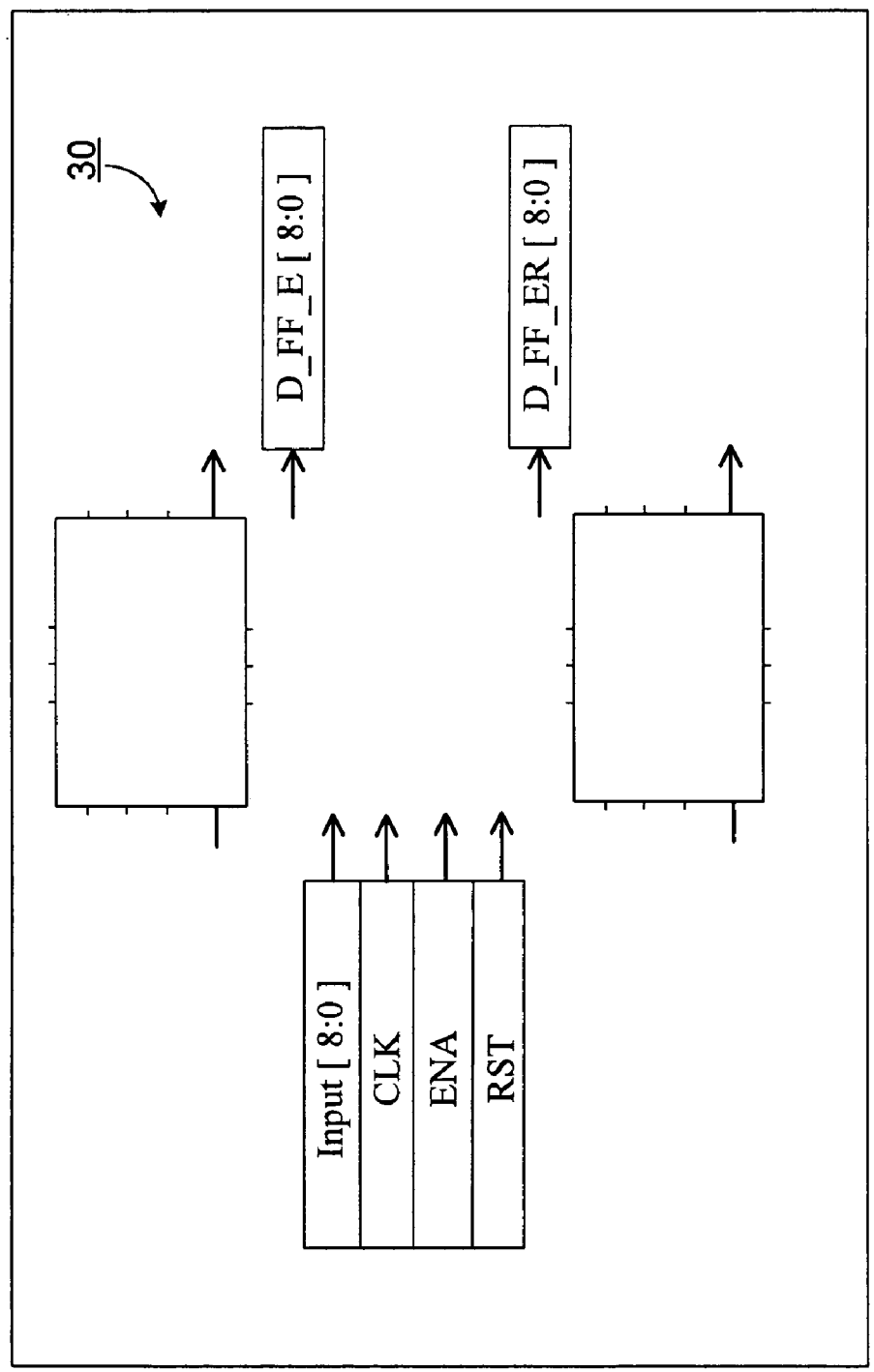
FIG. 3 shows functional block diagrams that were selected from the menu.

Process 10 creates (104) a graphical representation of a logic design using retrieved (103) functional block diagrams. That is, process 10 displays the retrieved functional block diagrams and the designer arranges the functional block diagrams to represent a logic design. Although the designer is moving the block diagrams by, e.g., dragging and dropping, process 10 arranges (104*a*) the block diagrams in the sense that their movement is executed and stored via process 10. FIG. 3 shows functional block diagrams 30 that have been arranged prior to being interconnected.

Figure 4:
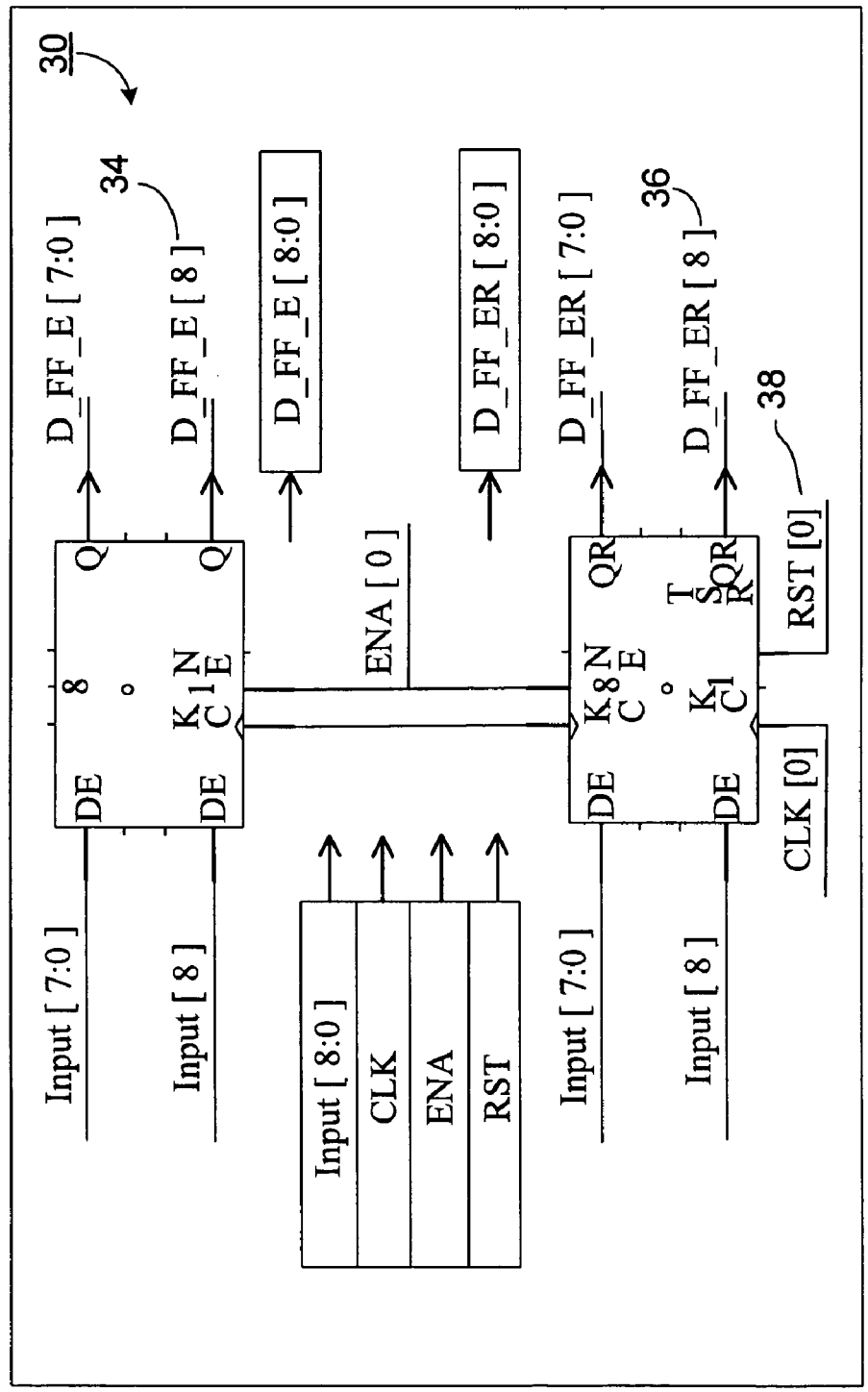
FIG. 4 shows the functional block diagrams of FIG. 3 interconnected using virtual wire.

Once the functional block diagrams are arranged, process 10 interconnects (104*b*) the block diagrams using virtual wires. That is, the designer selects wire option 22 from menu 12 and connects the inputs and/or outputs thereof using the virtual wires. Process 10 stores the configuration of the logic design, including the virtual wire connections, in memory. FIG. 4 shows the functional block diagrams of FIG. 3 following interconnection. It is noted that process 10 may display the definitions (e.g., 34, 36 and 38) of each input or output terminal, or not, as desired.

If there are any problems with the interconnections (107), process 10 displays a visual indication of the problem(s) with the design. In this regard, process 10 automatically runs a diagnostic on the logic design to confirm that the logic design comports with a set of predefined rules specifying, e.g., proper connections between terminals on different functional block diagrams. Examples of connection problems include, but are not limited to, unterminated connections and outputs running into the wrong inputs (e.g., a logic gate output running into a clock terminal input).

In this embodiment, process 10 illuminates the logic design in red if there is a problem. Other indicators may be provided instead of, or in addition, to, illuminating the logic design in red. For example, the indication may specify the nature of the problem in words or graphics and its location within the logic design.

If there are any problems with the displayed logic design, process 10 returns to one of the previous blocks 101, 102, 103, and 104, where the problem may be corrected.

Assuming that there are no problems with the design, or that the problems have been corrected, process 10 generates (105) simulation code for the design. In this embodiment, process 10 generates Verilog, VHDL, and/or C++ simulation code. However, the simulation code is not limited to generating only these two types of simulation code.

Generally speaking, the designer may select, e.g., via a GUI (not shown), which simulation code (C++, VHDL, Verilog) process 10 will generate. The type of simulation desired may dictate the simulation code that process 10 will generate.

Process 10 generates the simulation code knowing the functional block diagrams that make up the logic design, their inputs and outputs, and their interconnections. For each functional block diagram, process 10 generates appropriate simulation code and provides the appropriate inputs and outputs. Process 10 combines the generated simulation code for the various functional block diagrams into simulation code that defines the logic design.

Once simulation code for the logic design has been generated (105), process 10 tests (106) the logic design. This may be done by propagating one or more states through the simulation code and determining if there is an error based on the state propagation. For example, process 10 may propagate a logical one (1), a logical zero (0), and/or an undefined (X) state through the simulation code. If the resulting output of the simulation code is not what is expected, process 10 will indicate to the logic designer that an error exists in the logic design. The designer may then go back and change the logic design, as desired.

FIG. 5 shows a computer 40 on which process 10 may be executed. Computer 40 includes a processor 42, a memory 44, and a storage medium 46 (e.g., a hard disk) (see view 48). Storage medium 46 stores data 50 that defines a logic design, a database 52 that includes the functional block diagrams, simulation code 54 (e.g., C++, Verilog, VHDL) for each functional block diagram and for the resulting logic design, and machine-executable instructions 56, which are executed by processor 42 out of memory 44 to perform process 10.

Process 10, however, is not limited to use with the hardware and software of FIG. 5; it may find applicability in any computing or processing environment. Process 10 may be implemented in hardware, software, or a combination of the two. Process 10 may be implemented in one or more computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform process 10.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM (compact disc read-only memory), hard disk, or magnetic diskette), that is readable by a general or special purpose programmable machine for configuring and operating the machine when the storage medium or device is read by the machine to perform process 10. Process 10 may also be implemented as a machine-readable storage medium, configured with a computer program, where, upon execution, instructions in the program cause the machine to operate in accordance with process 10.

The invention is not limited to the specific embodiments set forth above. For example, process 10 is not limited to the types and content of displays described herein. Other displays and display contents may be used. Process 10 is not limited use with the simulation languages noted above, e.g., Verilog, VHDL, and C++. Process 10 also is not limited to the order of execution set forth in FIG. 1. That is, the blocks of process 10 may be executed in a different order than that shown to produce a desired result.

Other embodiments not described herein are also within the scope of the following claims.

What is claimed is:

1. A method of modeling a logic design, comprising:
   creating a graphical representation of the logic design;
   receiving a selection that corresponds to a type of simulation code, the selection corresponding to one of plural different simulation languages;
   generating simulation code based on the graphical representation and the selection, the simulation code comprising executable code in one of the plural different simulation languages that corresponds to the selection; and
   using the simulation code to test operation of the logic design, wherein using the simulation code comprises:
   propagating a state through the simulation code; and
   determining if there is an error in the logic design based on a propagated state, wherein determining is performed via executable instructions that operate absent user intervention.

2. The method of claim 1, wherein the graphical representation is comprised of functional block diagrams and virtual wires that interconnect the functional block diagrams.

3. The method of claim 2, wherein creating comprises:
   retrieving the functional block diagrams from a database; and
   arranging the functional block diagrams and the virtual wires to model the logic design.

4. The method of claim 2, wherein creating comprises:
   defining the functional block diagrams using simulation code; and
   arranging the functional block diagrams and the virtual wires to model the logic design.

5. The method of claim 1, further comprising:
   displaying a menu comprised of different types of functional block diagrams;
   receiving an input selecting one of the different types of functional block diagrams;
   retrieving a selected functional block diagram; and
   creating the graphical representation of the logic design using the selected functional block diagram.

6. The method of claim 1, wherein the state comprises one of a zero state, a one state, and an undefined state.

7. The method of claim 1, further comprising:
   providing a visual indication if there is an error in the graphical representation of the logic design.

8. A method of modeling a logic design, comprising:
   displaying a menu comprised of different types of functional block diagrams;
   receiving an input selecting one of the different types of functional block diagrams;
   receiving a selection that corresponds to a type of simulation code, the selection corresponding to one of plural different simulation languages;
   retrieving a selected functional block diagram;
   creating a graphical representation of a logic design using the selected functional block diagram, wherein creating comprises:
   interconnecting the selected functional block diagram with one or more other functional block diagrams to generate a model of the logic design; and defining the selected functional block diagram using the type of simulation code if a function of the selected functional block diagram is undefined when retrieved;

generating simulation code to simulate operation of the logic design based on the graphical representation and the selection, the simulation code comprising executable code in one of the plural different simulation languages that corresponds to the selection; and using the simulation code to test the operation of the logic design, wherein using the simulation code comprises:

determining if there is an error in the logic design based on a propagated state, wherein determining is performed via executable instructions that operate absent user intervention.

9. An article comprising a machine-readable medium that stores executable instructions for modeling a logic design, the instructions causing a machine to:

create a graphical representation of the logic design;

receive a selection that corresponds to a type of simulation code, the selection corresponding to one of plural different simulation languages;

generate simulation code based on the graphical representation and the selection, the simulation code comprising executable code in one of the plural different simulation languages that corresponds to the selection; and use the simulation code to test operation of the logic design, wherein using the simulation code comprises:

propagating a state through the simulation code; and determining if there is an error in the logic design based on a propagated state, wherein determining is performed via executable instructions that operate absent user intervention.

10. The article of claim 9, wherein the graphical representation is comprised of functional block diagrams and virtual wires that interconnect the functional block diagrams.

11. The article of claim 10, wherein creating comprises:

retrieving the functional block diagrams from a database; and arranging the functional block diagrams and the virtual wires to model the logic design.

12. The article of claim 10, wherein creating comprises:

defining the functional block diagrams using simulation code; and arranging the functional block diagrams and the virtual wires to model the logic design.

13. The article of claim 9, further comprising instructions that cause the machine to:

display a menu comprised of different types of functional block diagrams;

receive an input selecting one of the different types of functional block diagrams;

retrieve a selected functional block diagram; and create the graphical representation of the logic design using the selected functional block diagram.

14. The article of claim 9, wherein the state comprises one of a zero state, a one state, and an undefined state.

15. The article of claim 9, further comprising instructions that cause the machine to:

provide a visual indication if there is an error in the graphical representation of the logic design.

16. An article comprising a machine-readable medium that stores executable instructions that cause a machine to:

display a menu comprised of different types of functional block diagrams;

receive an input selecting one of the different types of functional block diagrams;

receive a selection that corresponds to a type of simulation code, the selection corresponding to one of plural different simulation languages;

retrieve a selected functional block diagram;

create a graphical representation of a logic design using the selected functional block diagram, wherein creating comprises:

interconnecting the selected functional block diagram with one or more other functional block diagrams to generate a model of the logic design; and defining the selected functional block diagram using the type of simulation code if a function of the selected functional block diagram is undefined when retrieved;

generate simulation code to simulate operation of the logic design based on the graphical representation and the selection, the simulation code comprising executable code in one of the plural different simulation languages that corresponds to the selection; and use the simulation code to test the operation of the logic design, wherein using the simulation code comprises:

determining if there is an error in the logic design based on a propagated state, wherein determining is performed via executable instructions that operate absent user intervention.

17. An apparatus for modeling a logic design, comprising:
memory that stores executable instructions; and
a processor that executes the instructions to:

create a graphical representation of the logic design;

receive a selection that corresponds to a type of simulation code, the selection corresponding to one of plural different simulation languages;

generate simulation code based on the graphical representation and the selection, the simulation code comprising executable code in one of the plural different simulation languages that corresponds to the selection; and use the simulation code to test operation of the logic design, wherein using the simulation code comprises:

propagating a state through the simulation code; and determining if there is an error in the logic design based on a propagated state, wherein determining is performed via executable instructions that operate absent user intervention.

18. The apparatus of claim 17, wherein the graphical representation is comprised of functional block diagrams and virtual wires that interconnect the functional block diagrams.

19. The apparatus of claim 18, wherein creating comprises:

retrieving the functional block diagrams from a database; and arranging the functional block diagrams and the virtual wires to model the logic design.

20. The apparatus of claim 18, wherein creating comprises:

defining the functional block diagrams using simulation code; and arranging the functional block diagrams and the virtual wires to model the logic design.

21. The apparatus of claim 17, wherein the processor executes instructions to:

display a menu comprised of different types of functional block diagrams;

receive an input selecting one of the different types of
functional block diagrams;
retrieve a selected functional block diagram; and
create the graphical representation of the logic design
using the selected functional block diagram.

22. The apparatus of claim 17, wherein the state comprises one of a zero state, a one state, and an undefined state.

23. The apparatus of claim 17, wherein the processor executes instructions to:
provide a visual indication if there is an error in the graphical representation of the logic design.

24. An apparatus comprising:
memory that stores executable instructions; and
a processor that executes the instructions to:
display a menu comprised of different types of functional block diagrams;
receive an input selecting one of the different types of functional block diagrams;
receive a selection that corresponds to a type of simulation code, the selection corresponding to one of plural different simulation languages;
retrieve a selected functional block diagram; and
create a graphical representation of a logic design using the selected functional block diagram, wherein creating comprises:
interconnecting the selected functional block diagram with one or more other functional block diagrams to generate a model of the logic design; and
defining the selected functional block diagram using the type of simulation code if a function of the selected functional block diagram is undefined when retrieved;
generate simulation code to simulate operation of the logic design based on the graphical representation and the selection, the simulation code comprising executable code in one of the plural different simulation languages that corresponds to the selection; and
use the simulation code to test the operation of the logic design, wherein using comprises:
determining if there is an error in the logic design based on a propagated state, wherein determining is performed via executable instructions that operate absent user intervention.

\* \* \* \* \*